(12) United States Patent
Yoshimura

(10) Patent No.: US 8,661,376 B2
(45) Date of Patent: Feb. 25, 2014

(54) EDITING SYSTEM

(71) Applicant: Toshiya Yoshimura, Kanagawa (JP)

(72) Inventor: Toshiya Yoshimura, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/758,106

(22) Filed: Feb. 4, 2013

(65) Prior Publication Data

US 2013/0205270 A1    Aug. 8, 2013

(30) Foreign Application Priority Data

Feb. 7, 2012   (JP) ................................. 2012-024489

(51) Int. Cl.
   *G06F 17/50*    (2006.01)
(52) U.S. Cl.
   USPC ......................................... 716/102; 716/101
(58) Field of Classification Search
   USPC ................................. 716/100–105
   See application file for complete search history.

(56) References Cited

U.S. PATENT DOCUMENTS

| | | | |
|---|---|---|---|
| 6,725,442 B1* | 4/2004 | Cote et al. | 716/126 |
| 2008/0005713 A1* | 1/2008 | Singh et al. | 716/11 |
| 2011/0066994 A1 | 3/2011 | Kunimoto et al. | |

FOREIGN PATENT DOCUMENTS

| | | |
|---|---|---|
| JP | 2009-223697 | 10/2009 |
| JP | 2009-223698 | 10/2009 |
| JP | 2010-157194 | 7/2010 |

* cited by examiner

*Primary Examiner* — Binh Tat
(74) *Attorney, Agent, or Firm* — IPUSA, PLLC

(57) ABSTRACT

An editing system includes a database server apparatus having product specification management data stored therein; and a terminal apparatus including: a display part displaying a function tree and an IO table, the function tree hierarchically indicating elements along with attributes of each of the elements based on the product specification management data and having a product name as a root of the function tree, and the IO table indicating connection data between each pin of the elements based on the product specification management data, an accepting part accepting an operation to connect one element to another element, an operation to display connection data between the elements, and an operation to edit each item of the connection data of the IO table, and an updating part updating the connection data of the product specification management data in accordance with the operations accepted by the operation accepting part.

5 Claims, 34 Drawing Sheets

FIG.1B RELATED ARE
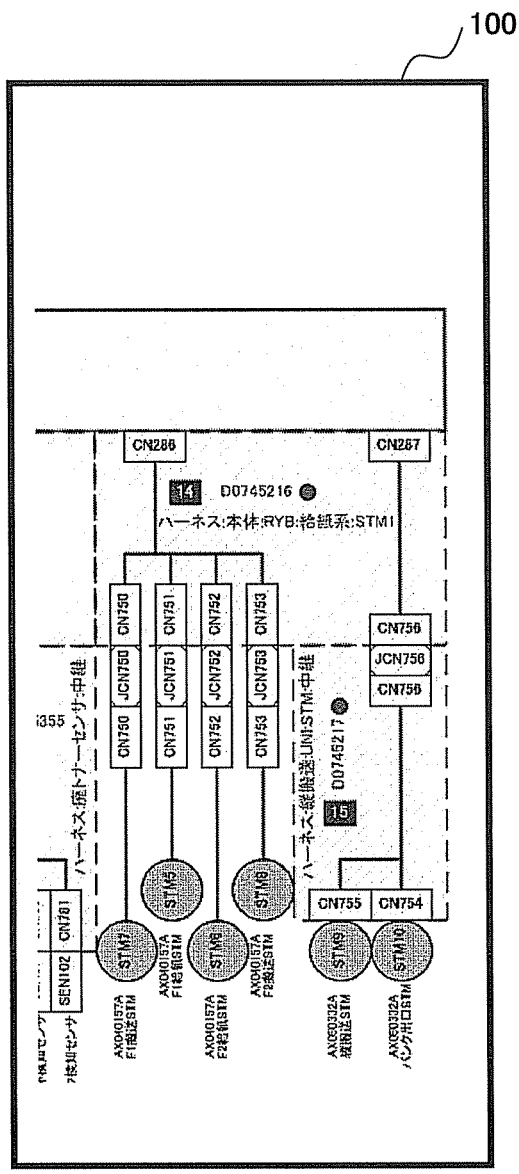

| DEVICE TYPE TABLE | |
|---|---|
| ITEM | DESCRIPTION |
| SUBJECT CODE | |
| DEVICE TYPE CODE | |
| DEVICE NAME | |
| : | |

| MODULE MANAGEMENT TABLE | |
|---|---|
| ITEM | DESCRIPTION |
| SUBJECT CODE | |
| FUNCTION MODULE ID | |
| PARENT FUNCTION MODULE ID | SET SUBJECT CODE IF IMMEDIATELY BELOW SUBJECT |
| FUNCTION NAME | |
| MODULE L | EMPLOYEE ID |
| : | |

FIG.6

FUNCTION COMPONENT MANAGEMENT TABLE ~T3

| ITEM | DESCRIPTION |
|---|---|
| SUBJECT CODE | |
| FUNCTION ID | UNIQUE |
| PARENT FUNCTION MODULE ID | |
| FUNCTION CATEGORY | 0: MECHATRONIC COMPONENT<br>1: SUBSTRATE<br>2: HARNESS |
| SELECTED COMPONENT COMPONENT NO. | COMPONENT NUMBER OF COMPONENT SELECTED FOR EXECUTING FUNCTION |
| FUNCTION NAME | UNIQUE WITHIN SUBJECT |
| FUNCTION DISTINGUISHER | IDENTIFYING CHARACTER CORRESPONDING TO EACH FUNCTION NAME |
| TYPE | SUBSTRATE TYPE<br>MECHATRONIC TYPE<br>HARNESS TYPE |
| PERSON IN CHARGE | EMPLOYEE ID |
| CONNECTION STATUS | INDICATE CONNECTION STATUS OF PIN<br>0: NOT CONNECTED (INDICATE WITH BLACK CHARACTERS IN FUNCTION TREE)<br>1: PARTLY CONNECTED (INDICATE WITH GREEN CHARACTERS IN FUNCTION TREE)<br>2: ALL CONNECTED (INDICATE WITH BLUE CHARACTERS IN FUNCTION TREE) |
| : | |

| COMPONENT SPECIFICATION MANAGEMENT TABLE ||
|---|---|
| ATTRIBUTE ITEM | DESCRIPTION |
| COMPONENT NUMBER | |
| TYPE | |
| : | |

| CONNECTOR MANAGEMENT TABLE ||
|---|---|
| ATTRIBUTE ITEM | DESCRIPTION |
| PARENT COMPONENT NUMBER | |
| CONNECTOR ADDRESS | |
| CONNECTOR COMPONENT NUMBER | |
| : | |

| PIN MANAGEMENT TABLE | |
|---|---|
| ITEM | DESCRIPTION |
| PARENT COMPONENT NUMBER | |
| CONNECTOR ADDRESS | |
| PIN NO. | |
| SIGNAL | |
| I/O | (I,O,B,P,G,N) |
| : | |

FIG.10

CONNECTION TABLE ~T7

| ATTRIBUTE ITEM | DESCRIPTION |
|---|---|
| FUNCTION ID | |
| CONNECTOR ADDRESS | |
| PIN NO. | |
| CONNECTION TARGET FUNCTION ID | FUNCTION COMPONENT ID OF CONNECTION TARGET |
| CONNECTOR ADDRESS OF CONNECTION TARGET | |
| PIN NO. OF CONNECTION TARGET | |
| DIRECTION | NOT SET, ←, →, ⇔, P, G, N |
| INSPECTION STATUS | NOT INSPECTED<br>INSPECTED<br>ERROR |
| ERROR ACKNOWLEDGEMENT STATUS | BLANK: ACKNOWLEDGEMENT UNNECESSARY<br>ACKNOWLEDGE (NAME OF PERSON IN CHARGE) : ACKNOWLEDGED<br>ERROR: ERROR |
| REASON FOR ACKNOWLEDGEMENT | |
| : | |

FIG.11A

| FUNCTION CONNECTION CONFIGURATION | NUMBER OF PINS | STATUS | TYPE | COMPONENT NO. | FUNCTION DISTIN-GUISHER | COMPONENT SPECIFI-CATION | DEVICE DEPENDENCY SPECIFICATION | LOADING DEVICE TYPE | UNIT | PERSON IN CHARGE | FUNCTION DISTIN-GUISHER | RE-MARKS |
|---|---|---|---|---|---|---|---|---|---|---|---|---|
| XXXXXXX | | | | | | | | | | | | |
| - CONTROLLER ELECTRIC SECTION | | REGISTERED IN FUNCTION LIST | | | | | | | | | | |
| ├ CTL | | UNDER PREPRATION | PCB | XXXXXXX | CTL | UNDECIDED | | | | | | |
| │  └ CN101 | 64 | NOT INSPECTED | CONNECTOR | XXXXXXX | CN101 | | | | | | | |
| └ CN301 BCU | | | | | | | | | | | | |
| - ENGINE ELECTRIC SECTION | | REGISTERED IN FUNCTION LIST | | | | | | | | | | |
| ├ BCU | | UNDER PREPRATION | PCB | XXXXXXX | BICU | UNDECIDED | | | | | | |
| │  └ CN301 | 64 | NOT INSPECTED | CONNECTOR | XXXXXXX | CN301 | | | | | | | |
| └ CN101 CTL | 64 | | | | | | | | | | | |
| - IOB | | APPROVED | PCB | XXXXXXX | IOB | UNDECIDED | | | | | | |
| │  └ CN230 | 25 | INSPECTED | CONNECTOR | XXXXXXX | CN228 | | | | | | | |
| │  ├ CN1 DOCUMENT DETECTION SENSOR | 12 | | BRUSHLESS MOTOR | D5165200 | DRMMT_C | DECIDED | DECIDED | ALL SMALL DEVICE TYPES | MAIN BODY | XXXX | XXXX | |
| │  └ CN1 DRUM DEVELOPMENT MOTOR | 12 | | BRUSHLESS MOTOR | D5165200 | DRMMT_Y | DECIDED | DECIDED | ALL SMALL DEVICE TYPES | MAIN BODY | XXXX | XXXX | |
| - MAIN BODY DRIVE SECTION | | REGISTERED IN FUNCTION LIST | | | | | | | | | | |
| - DRUM DEVELOPMENT MOTOR (Y) | | APPROVED | BRUSHLESS MOTOR | D5165200 | DRMMT_Y | DECIDED | DECIDED | ALL SMALL DEVICE TYPES | MAIN BODY | XXXX | XXXX | |
| │  ├ CN1 | 12 | | | | | | | | | | | |
| │  └ CN228 IOB | | | | | | | | | | | | |
| - DRUM DEVELOPMENT MOTOR (M) | | APPROVED | BRUSHLESS MOTOR | D5165200 | DRMMT_M | DECIDED | DECIDED | ALL SMALL DEVICE TYPES | MAIN BODY | XXXX | XXXX | |
| └ CN1 | 12 | | | | | | | | | | | |

FIG.11B

| | | | | | | | | | |
|---|---|---|---|---|---|---|---|---|---|
| − DRUM DEVELOPMENT MOTOR (C)<br>  ├ CN1<br>  └ CN228 10B | 12 | APPROVED | BRUSHLESS MOTOR | D5165200 | DRMMT_C | DECIDED | DECIDED | ALL SMALL DEVICE TYPES | MAIN BODY | XXXX | XXXX | XXXX |
| − DRUM DEVELOPMENT MOTOR (K)<br>  ├ CN1 | 12 | APPROVED | BRUSHLESS MOTOR | D5165200 | DRMMT_K | DECIDED | DECIDED | ALL SMALL DEVICE TYPES | MAIN BODY | XXXX | XXXX | XXXX |
| − INTERMEDIATE TRANSFER MOTOR<br>  ├ CN1 | 14 | APPROVED | BRUSHLESS MOTOR | AX060333B | TR1MT | DECIDED | DECIDED | ALL SMALL DEVICE TYPES | MAIN BODY | XXXX | XXXX | XXXX |
| − TONER CONVEY MOTOR<br>  ├ CN1 | 14 | APPROVED | BRUSHLESS MOTOR | AX060356B | TONMT | DECIDED | DECIDED | ALL SMALL DEVICE TYPES | INTERMEDIATE TRANSFER | XXXX | XXXX | XXXX |
| − DISCHARGE MOTOR<br>  ├ CN1 | 14 | APPROVED | BRUSHLESS MOTOR | AX060369B | FUMT | DECIDED | DECIDED | ALL SMALL DEVICE TYPES | DEVELOPMENT | XXXX | XXXX | XXXX |
| − INTERMEDIATE TRANSFER SEPARATION MOTOR<br>  ├ CN1 | 5 | APPROVED | BRUSH MOTOR | B2231199A | MRMT | DECIDED | DECIDED | ALL SMALL DEVICE TYPES | INTERMEDIATE TRANSFER | XXXX | XXXX | XXXX |
| − SECONDARY TRANSFER SEPARATION MOTOR<br>  ├ CN1 | 5 | APPROVED | BRUSH MOTOR | ATE083840 | SRMT | DECIDED | DECIDED | ALL SMALL DEVICE TYPES | MAIN BODY | XXXX | XXXX | XXXX |
| − FIXING SECTION<br>  ├ XXXXXXXXXX<br>  └ YYYYYYYYY | | X | | XXXXXXX<br>YYYYYYY | XXXXXXX<br>YYYYYYY | XXXXXXX<br>YYYYYYY | | XXXXXXX<br>YYYYYYY | | XXXX<br>YYYY | XXXX<br>YYYY | XXXX<br>YYYY |

FIG.12

| INSPECTION STATUS | ERROR MESSAGE | ERROR ACKNOWL- EDGEMENT | REASON FOR ACKNOWL- EDGEMENT | CONNECTION SOURCE ||||| I/O DIRECTION | CONNECTION TARGET |||||
|---|---|---|---|---|---|---|---|---|---|---|---|---|---|---|
| | | | | FUNCTION NAME | CONNECTOR ADDRESS | PIN NO. | SIGNAL NAME | I/O | | FUNCTION NAME | CONNECTOR ADDRESS | PIN NO. | SIGNAL NAME | I/O |
| INSPECTED | | | | IO CONTROL BOARD (IOB) | CN230 | 1 | GND | G | G | DOCUMENT DETECTION SENSOR (SCNSNS) | CN1 | 1 | GND | G |
| INSPECTED | | | | | | 2 | SCNSNS_SN | P | ↓ | | | 2 | SN | O |
| INSPECTED | | | | | | 3 | +5V | P | P | | | 3 | +5V | P |

FIG.13

| SUB-STRATE | CN NAME | PIN NO. | SIGNAL NAME | I/O | LOGIC | PIN NO. | SIGNAL NAME | DESCRIPTION | I/O | CONNECTION TARGET |
|---|---|---|---|---|---|---|---|---|---|---|
| IOB | | | DRMMT_C_GA | O | | 12 | GA | SWITCH GAIN | I | DRUM DEVELOPMENT MOTOR C (DRMMT_C) |
| | | | DRMMT_C_CLK | O | | 11 | CLK | CLOCK | I | |
| | | | DRMMT_C_BRK_N | O | BRAKE: L | 10 | BRK_N | BRAKE | I | |
| | | | DRMMT_C_CW_N | O | CW: L | 9 | CW_N | ROTATION DIRECTION | I | |
| | | | DRMMT_C_STA_N | O | START: L | 8 | STA_N | START | I | |
| | | | DRMMT_C_LOK_N | I | LOCK: L | 7 | LOK_N | LOCK | O | |
| | | | +5V | P | | 6 | +5V | +5V | P | |
| | | | GND | G | | 5 | GND | | G | |
| | | | GND | G | | 4 | GND | | G | |
| | | | GND | G | | 3 | GND | | G | |
| | | | +24V | P | | 2 | +24V | +24V | P | |
| | | | +24V | P | | 1 | +24V | | P | |
| | | | N.C. | N | | | | | | |
| | | | DRMMT_Y_GA | O | | 12 | GA | SWITCH GAIN | I | DRUM DEVELOPMENT MOTOR Y (DRMMT_Y) |
| | | | DRMMT_Y_CLK | O | | 11 | CLK | CLOCK | I | |
| | | | DRMMT_Y_BRK_N | O | BRAKE: L | 10 | BRK_N | ROTATION DIRECTION | I | |
| | | | DRMMT_Y_CW_N | O | CW: L | 9 | CW_N | BRAKE | I | |
| | | | DRMMT_Y_STA_N | O | START: L | 8 | STA_N | START/STOP | I | |
| | | | DRMMT_Y_LOK_N | I | LOCK: L | 7 | LOK_N | LOCK | O | |
| | | | +5V | P | | 6 | +5V | +5V | P | |
| | | | GND | G | | 5 | GND | GND(5V) | G | |
| | | | GND | G | | 4 | GND | GND(24V) | G | |
| | | | GND | G | | 3 | GND | GND(24V) | G | |
| | | | +24V | P | | 2 | +24V | +24V | P | |
| | | | +24V | P | | 1 | +24V | +24V | P | |
| | | | N.C. | N | | | | | | |

| DEVICE TYPE TABLE RECORD | |
|---|---|
| ITEM | VALUE |
| SUBJECT CODE | AFN01 |
| DEVICE TYPE CODE | 000001 |
| DEVICE TYPE NAME | XXXXXXX |
| : | |

| MODULE MANAGEMENT TABLE RECORD | |
|---|---|
| ITEM | VALUE |
| SUBJECT CODE | AFN01 |
| FUNCTION MODULE ID | 1001 |
| PARENT FUNCTION MODULE ID | AFN01 |
| FUNCTION NAME | ENGINE ELECTRIC SECTION |
| MODULE L | 12345 |
| : | : |

| FUNCTION COMPONENT MANAGEMENT TABLE RECORD | |
|---|---|
| ITEM | VALUE |
| SUBJECT CODE | AFN01 |
| FUNCTION ID | 0001 |
| PARENT FUNCTION MODULE ID | 1001 |
| FUNCTION CATEGORY | 1 |
| SELECTED COMPONENT COMPONENT NO. | AFE015122 |
| FUNCTION NAME | IO CONTROL BOARD |
| FUNCTION DISTINGUISHER | IOB |
| TYPE | PCB |
| PERSON IN CHARGE | 400532 |
| CONNECTION STATUS | 2 |
| : | : |

| COMPONENT SPECIFICATION MANAGEMENT TABLE RECORD | |
|---|---|
| ATTRIBUTE ITEM | VALUE |
| COMPONENT NO. | AFE015122 |
| TYPE | IO CONTROL BOARD |
| : | : |

| CONNECTOR MANAGEMENT TABLE RECORD | |
|---|---|
| ATTRIBUTE ITEM | VALUE |
| PARENT COMPONENT NO. | AFE015122 |
| CONNECTOR ADDRESS | CN230 |
| CONNECTOR COMPONENT NO. | 11034010 |
| : | : |

| PIN MANAGEMENT TABLE RECORD | |
|---|---|
| ITEM | VALUE |
| PARENT COMPONENT NO. | AFE015122 |
| CONNECTOR ADDRESS | CN230 |
| PIN NO. | 1 |
| SIGNAL | GND |
| I/O | G |
| : | : |

| PIN MANAGEMENT TABLE RECORD ||
|---|---|
| ITEM | VALUE |
| PARENT COMPONENT NO. | AFE015122 |
| CONNECTOR ADDRESS | CN230 |
| PIN NO. | 2 |
| SIGNAL | SCNSNS_SN |
| I/O | O |
| : | : |

| PIN MANAGEMENT TABLE RECORD ||
|---|---|
| ITEM | VALUE |
| PARENT COMPONENT NO. | AFE015122 |
| CONNECTOR ADDRESS | CN230 |
| PIN NO. | 3 |
| SIGNAL | +5V |
| I/O | O |
| : | : |

FIG.15A

| CONNECTION TABLE RECORD | | |
|---|---|---|
| ATTRIBUTE ITEM | | REMARKS |
| FUNCTION ID | 0001 | |
| CONNECTOR ADDRESS | CN230 | |
| PIN NO. | 1 | |
| CONNECTION TARGET FUNCTION ID | 0002 | |
| CONNECTION TARGET CONNECTOR ADDRESS | CN1 | |
| CONNECTION TARGET PIN NO. | 1 | |
| DIRECTION | G | |
| INSPECTION STATUS | INSPECTED | |
| ERROR ACKNOWLEDGEMENT STATUS | | |
| REASON FOR ACKNOWLEDGEMENT | | |
| : | : | |

| CONNECTION TABLE RECORD | |
|---|---|
| ATTRIBUTE ITEM | REMARKS |
| FUNCTION ID | 0001 |
| CONNECTOR ADDRESS | CN230 |
| PIN NO. | 2 |
| CONNECTION TARGET FUNCTION ID | 0002 |
| CONNECTION TARGET CONNECTOR ADDRESS | CN1 |
| CONNECTION TARGET PIN NO. | 2 |
| DIRECTION | ↓ |
| INSPECTION STATUS | INSPECTED |
| ERROR ACKNOWLEDGEMENT STATUS | |
| REASON FOR ACKNOWLEDGEMENT | |
| : | : |

FIG.15C

| CONNECTION TABLE RECORD | | ~T7-3 |
|---|---|---|
| ATTRIBUTE ITEM | | REMARKS |
| FUNCTION ID | 0001 | |
| CONNECTOR ADDRESS | CN230 | |
| PIN NO. | 3 | |
| CONNECTION TARGET FUNCTION ID | 0002 | |
| CONNECTION TARGET CONNECTOR ADDRESS | CN1 | |
| CONNECTION TARGET PIN NO. | 3 | |
| DIRECTION | P | |
| INSPECTION STATUS | INSPECTED | |
| ERROR ACKNOWLEDGEMENT STATUS | | |
| REASON FOR ACKNOWLEDGEMENT | | |
| : | | : |

FIG.16A

FUNCTION COMPONENT MANAGEMENT TABLE RECORD ~T3-2

| ITEM | VALUE |
|---|---|
| SUBJECT CODE | AFN01 |
| FUNCTION ID | 0002 |
| PARENT FUNCTION MODULE ID | 1001 |
| FUNCTION CATEGORY | 0 |
| SELECTED COMPONENT COMPONENT NO. | AX060443 |
| FUNCTION NAME | DOCUMENT DETECTION SENSOR |
| FUNCTION DISTINGUISHER | SCNSNS |
| TYPE | PHOTO SENSOR |
| PERSON IN CHARGE | 300674 |
| CONNECTION STATUS | 2 |
| ⋮ | ⋮ |

| COMPONENT SPECIFICATION MANAGEMENT TABLE RECORD ||
|---|---|
| ATTRIBUTE ITEM | VALUE |
| COMPONENT NO. | AX060443 |
| TYPE | IO CONTROL BOARD |
| : | : |

| CONNECTOR MANAGEMENT TABLE RECORD ||
|---|---|
| ATTRIBUTE ITEM | VALUE |
| PARENT COMPONENT NO. | AX060443 |
| CONNECTOR ADDRESS | CN1 |
| CONNECTOR COMPONENT NO. | 11034010 |
| : | : |

| PIN MANAGEMENT TABLE RECORD ||
|---|---|
| ITEM | VALUE |
| PARENT COMPONENT NO. | AX060443 |
| CONNECTOR ADDRESS | CN1 |
| PIN NO. | 1 |
| SIGNAL | GND |
| I/O | G |
| : | : |

| PIN MANAGEMENT TABLE RECORD ||
|---|---|
| ITEM | VALUE |
| PARENT COMPONENT NO. | AX060443 |
| CONNECTOR ADDRESS | CN1 |
| PIN NO. | 2 |
| SIGNAL | SN |
| I/O | O |
| : | : |

| PIN MANAGEMENT TABLE RECORD ||
|---|---|
| ITEM | VALUE |
| PARENT COMPONENT NO. | AX060443 |
| CONNECTOR ADDRESS | CN1 |
| PIN NO. | 3 |
| SIGNAL | +5V |
| I/O | P |
| : | : |

FIG.17

```
XXXXXXX
   | — ENGINE ELECTRIC SECTION
   |     | — IO CONTROL BOARD 1
   |     |     | — CN UNDECIDED
   |     |           | — CN1 DRUM MOTOR Y
   |     |           | — CN1 DRUM MOTOR M
   |     |           | — CN1 DRUM MOTOR C
   |     |           | — CN1 DRUM MOTOR K
   |     |
   |     | — IO CONTROL BOARD 2
   |           | — CN UNDECIDED
   |
   | — READING SECTION
   |     | — DOCUMENT DETECTION SENSOR 1
   |     |     | — CN1
   |     | — DOCUMENT DETECTION SENSOR 2
   |     |     | — CN1
   |     | — DOCUMENT DETECTION SENSOR 3
   |           | — CN1
   | — DEVELOPMENT SECTION
   |     | — DRUM MOTOR Y
   |     |     | — CN1
   |     | — DRUM MOTOR M
   |     |     | — CN1
   |     | — DRUM MOTOR C
   |     |     | — CN1
   |     | — DRUM MOTOR K
   |           | — CN1
```

FIG.18

```
XXXXXXX
 | — ENGINE ELECTRIC SECTION
 |    | — IO CONTROL BOARD 1
 |    |    | — CN UNDECIDED
 |    |         | — CN1 DOCUMENT DETECTION SENSOR 1
 |    |         | — CN1 DOCUMENT DETECTION SENSOR 2
 |    |         | — CN1 DOCUMENT DETECTION SENSOR 3
 |    |         | — CN1 DRUM MOTOR Y
 |    |         | — CN1 DRUM MOTOR M
 |    |         | — CN1 DRUM MOTOR C
 |    |         | — CN1 DRUM MOTOR K
 |    |
 |    | — IO CONTROL BOARD 2
 |         | — CN UNDECIDED
 |
 | — READING SECTION
 |    | — DOCUMENT DETECTION SENSOR 1
 |    |    | — CN1
 |    | — DOCUMENT DETECTION SENSOR 2
 |    |    | — CN1
 |    | — DOCUMENT DETECTION SENSOR 3
 |    |    | — CN1
 | — DEVELOPMENT SECTION
 |    | — DRUM MOTOR Y
 |    |    | — CN1
 |    | — DRUM MOTOR M
 |    |    | — CN1
 |    | — DRUM MOTOR C
 |    |    | — CN1
 |    | — DRUM MOTOR K
 |         | — CN1
```

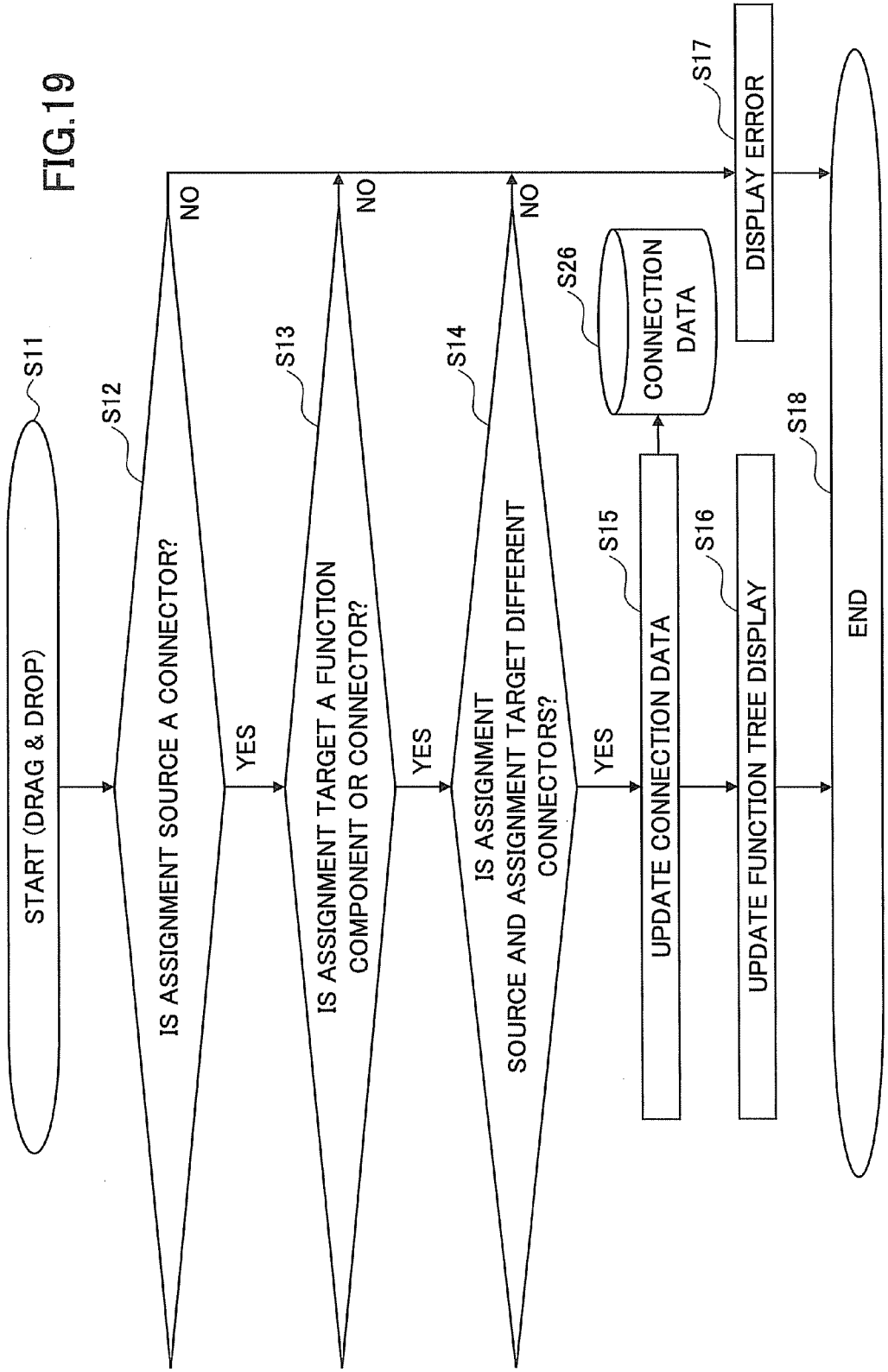

FIG.20B

| SUB-STRATE | CN NAME | PIN NO. | SIGNAL NAME | I/O | LOGIC | PIN NO. | SIGNAL NAME | DESCRIPTION | I/O | CONNECTION TARGET |
|---|---|---|---|---|---|---|---|---|---|---|
| IOB | | | | | | 12 | GA | SWITCH GAIN | I | |
| | | | | | | 11 | CLK | CLOCK | I | |
| | | | | | | 10 | BRK_N | BRAKE | I | |
| | | | | | | 9 | CW_N | ROTATION DIRECTION | I | DRUM DEVELOPMENT MOTOR C |
| | | | | BRAKE: L | 8 | STA_N | START | I | |
| | | | | CW: L | 7 | LOK_N | LOCK | O | |
| | | | | START: L | 6 | +5V | +5V | P | |
| | | | | LOCK: L | 5 | GND | | G | (DRMMT_C) |
| | | | | | 4 | GND | | G | |
| | | | | | 3 | GND | | G | |
| | | | | | 2 | +24V | | P | |
| | | | | | 1 | +24V | +24V | P | |
| | | | | | 12 | GA | SWITCH GAIN | I | |
| | | | | | 11 | CLK | CLOCK | I | |
| | | | | | 10 | BRK_N | BRAKE | I | |
| | | | | BRAKE: L | 9 | CW_N | ROTATION DIRECTION | I | DRUM DEVELOPMENT MOTOR Y |
| | | | | CW: L | 8 | STA_N | START/STOP | I | |
| | | | | START: L | 7 | LOK_N | LOCK | O | |
| | | | | LOCK: L | 6 | +5V | +5V | P | |
| | | | | | 5 | GND | GND(5V) | G | (DRMMT_Y) |
| | | | | | 4 | GND | GND(24V) | G | |
| | | | | | 3 | GND | GND(24V) | G | |
| | | | | | 2 | +24V | +24V | P | |
| | | | | | 1 | +24V | +24V | P | |

FIG.22

| SUB-STRATE NAME | CONNECTION SOURCE (PCB SIDE) | | | | CONNECTION TARGET (MECHATRONIC COMPONENT SIDE) | | | | CONNECTION TARGET |
|---|---|---|---|---|---|---|---|---|---|
| | CN NAME | PIN NO. | SIGNAL NAME | I/O | LOGIC | PIN NO. | SIGNAL NAME | DESCRIPTION | I/O | |
| IOB | | | DRMMT_C_GA | O | | 12 | GA | SWITCH GAIN | I | DRUM DEVELOPMENT MOTOR C (DRMMT_C) |
| | | | DRMMT_C_CLK | O | | 11 | CLK | CLOCK | I | |
| | | | DRMMT_C_BRK_N | O | BRAKE: L | 10 | BRK_N | BRAKE | I | |
| | | | DRMMT_C_CW_N | O | CW: L | 9 | CW_N | ROTATION DIRECTION | I | |
| | | | DRMMT_C_STA_N | O | START: L | 8 | STA_N | START | I | |
| | | | DRMMT_C_LOK_N | I | LOCK: L | 7 | LOK_N | LOCK | O | |
| | | | +5V | P | | 6 | +5V | +5V | P | |
| | | | GND | G | | 5 | GND | | G | |
| | | | GND | G | | 4 | GND | | G | |
| | | | GND | G | | 3 | GND | | G | |
| | | | +24V | P | | 2 | +24V | +24V | P | |
| | | | +24V | P | | 1 | +24V | | P | |
| | | | N.C. | N | | | | | | |
| | | | DRMMT_Y_GA | O | | 12 | GA | SWITCH GAIN | I | DRUM DEVELOPMENT MOTOR Y (DRMMT_Y) |
| | | | DRMMT_Y_CLK | O | | 11 | CLK | CLOCK | I | |
| | | | DRMMT_Y_BRK_N | O | BRAKE: L | 10 | BRK_N | BRAKE | I | |
| | | | DRMMT_Y_CW_N | O | CW: L | 9 | CW_N | ROTATION DIRECTION | I | |
| | | | DRMMT_Y_STA_N | O | START: L | 8 | STA_N | START/STOP | I | |
| | | | DRMMT_Y_LOK_N | I | LOCK: L | 7 | LOK_N | LOCK | O | |
| | | | +5V | P | | 6 | +5V | +5V | P | |
| | | | GND | G | | 5 | GND | GND(5V) | G | |
| | | | GND | G | | 4 | GND | GND(24V) | G | |
| | | | GND | G | | 3 | GND | GND(24V) | G | |
| | | | +24V | P | | 2 | +24V | +24V | P | |
| | | | +24V | P | | 1 | +24V | +24V | P | |
| | | | N.C. | N | | | | | | |

FIG.24B

| SUB-STRATE | CN NAME | PIN NO. | SIGNAL NAME | I/O | | PIN NO. | SIGNAL NAME | DESCRIPTION | I/O | CONNECTION TARGET |
|---|---|---|---|---|---|---|---|---|---|---|
| IOB | CN230 | 1 | GND | O | | 1 | GND | GND | G | DOCUMENT DETECTION SENSOR 0 (SCNSNS0) |
| | | 2 | SCNSNS0_SN | O | | 2 | SN | OUTPUT | O | |
| | | 3 | +5V | O | | 3 | +5V | POWER SOURCE | P | |
| | | 4 | N.C. | N | | | | | | |
| | | 5 | GND | O | | 1 | GND | GND | G | DOCUMENT DETECTION SENSOR 1 (SCNSNS1) |
| | | 6 | SCNSNS1_SN | O | | 2 | SN | OUTPUT | O | |
| | | 7 | +5V | P | | 3 | +5V | POWER SOURCE | P | |
| | | 8 | N.C. | N | | | | | | |

| SUB-STRATE | CN NAME | PIN NO. | SIGNAL NAME | I/O | | PIN NO. | SIGNAL NAME | DESCRIPTION | I/O | CONNECTION TARGET |
|---|---|---|---|---|---|---|---|---|---|---|
| IOB | CN230 | 1 | GND | O | | 1 | GND | GND | G | DOCUMENT DETECTION SENSOR 0 (SCNSNS0) |
| | | 2 | SN | | | 2 | SN | INPUT | O | |
| | | 3 | +5V | | | | | SOURCE | | |
| | | 4 | N.C. | N | | | | | | |
| | | 5 | GND | G | | 1 | +5V | POWER SOURCE | G | DOCUMENT DETECTION SENSOR 1 (SCNSNS1) |
| | | 6 | SCNSNS1_SN | O | | 2 | SN | OUTPUT | O | |
| | | 7 | +5V | P | | 3 | GND | GND | P | |
| | | 8 | N.C. | N | | | | | | |

ERROR: SIGNAL CONNECTION ERROR
INVERSE

EDITING SYSTEM

CROSS-REFERENCE TO RELATED APPLICATIONS

The present application is based on Japanese Priority Application No. 2012-024489 filed on Feb. 7, 2012, with the Japanese Patent Office, the entire contents of which are hereby incorporated by reference.

BACKGROUND OF THE INVENTION

1. Field of the Invention

The present invention relates to technology for designing a product such as a MFP (Multi Function Printer, Multi Function Peripheral).

2. Description of the Related Art

At the early stages of designing a product such as an MFP, product specifications are undefined. Thus, in these stages, product design is conducted while referring to a diagram (general view) 300 illustrating mutual connections between the electrical components included in the product, and an IO (Input/Output) table illustrating the connection relationship with respect to each pin of the connectors of the electric components, and by manually updating the data indicated by the general view 300 and the IO table. Here, the term "electric component" includes a component including one or more pins (terminals). The electric component may be, for example, a printed circuit board (PCB), a mechatronic component, or a wiring harness component. The mechatronic component may be, for example, a motor, a sensor, or a clutch.

FIGS. 1A and 1B are schematic diagrams for describing a process of editing the electric specifications of an entire product according to an example in the related art. In FIG. 1A, reference numeral 300 represents a general view illustrating mutual connections between the electrical components included in the product, and reference numeral 200 represents an IO table illustrating the connection relationship with respect to each pin of the connectors of the electric components. FIG. 1B is an enlarged view of a portion 100 of the general view 300. FIGS. 1A and 1B illustrate an example where the product includes a total of approximately 500 electric components (300 mechatronic components, 150 wiring harness components, 40 PCBs). In the process of designing the product, a designer of the product tests the connections assigned to the electric components and makes alterations and modifications while updating the data indicated by the general view 300 and the IO table 200.

As described above, in the early stages of designing a product according to an example in the related art, the designer uses the general view 300 and the IO table 200 and makes alterations and modifications while manually updating the data indicated by the general view 300 and the IO table. The process of updating the general view is not only burdensome but also leads to errors because the updating is performed manually. Further, error also occurs due to the difficulty of visually confirming the connection specifications of the entire product.

Japanese Laid-open Patent Publication Nos. 2009-223697 and 2009-223698 disclose a technology of supporting a development process by inspecting a design specification or a circuit diagram after review. However, this technology does not take into consideration the early stages of designing a product where specifications of the product are yet to be defined. Therefore, the disclosed technology does not solve the above-described problems.

SUMMARY OF THE INVENTION

The present invention provides an editing system that substantially obviates one or more of the problems caused by the limitations and disadvantages of the related art.

Features and advantages of the present invention are set forth in the description that follows, and in part will become apparent from the description and the accompanying drawings, or may be learned by practice of the invention according to the teachings provided in the description. Objects as well as other features and advantages of the present invention will be realized and attained by an editing system particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides an editing system including: a database server apparatus having product specification management data stored therein; and a terminal apparatus including: a display part configured to display a function tree and an IO table, the function tree hierarchically indicating elements along with attributes of each of the elements based on the product specification management data and having a product name as a root of the function tree, and the IO table indicating connection data between each pin of the elements based on the product specification management data, an accepting part configured to accept an operation to connect one of the elements to another one of the elements, an operation to display connection data between the elements, and an operation to edit each item of the connection data of the IO table, and an updating part configured to update the connection data of the product specification management data in accordance with the operations accepted by the operation accepting part.

Other objects, features and advantages of the present invention will become more apparent from the following detailed description when read in conjunction with the accompanying drawings.

BRIEF DESCRIPTION OF THE DRAWINGS

FIGS. 1A and 1B are schematic diagrams for describing a process of editing electric specifications of an entire product according to an example in the related art;

FIG. 4 is a schematic diagram illustrating an example of a device type table;

FIG. 5 is a schematic diagram illustrating an example of a module management table;

FIG. 6 is a schematic diagram illustrating an example of a function component management table;

FIG. 7 is a schematic diagram illustrating an example of a component specification management table;

FIG. 8 is a schematic diagram illustrating an example of a connector management table;

FIG. 9 is a schematic diagram illustrating an example of a pin management table;

FIG. 10 is a schematic diagram illustrating an example of a connection table;

FIGS. 11A and 11B are schematic diagrams illustrating a configuration of a function tree according to an embodiment of the present invention;

FIG. 12 is a schematic diagram illustrating a configuration of an IO table according to an embodiment of the present invention;

FIG. 13 is a schematic diagram illustrating another configuration of an IO table according to an embodiment of the present invention;

FIGS. 14A-16F illustrate examples of table records according to an embodiment of the present invention;

FIGS. 17 and 18 are schematic diagrams illustrating an example of an operation of assigning a connection between function components according to an embodiment of the present invention;

FIG. 19 is a flowchart of an example of a process of assigning a connection between function components according to an embodiment of the present invention;

FIGS. 20A and 20B are schematic diagrams illustrating an example of editing a connection in units of pins according to an embodiment of the present invention;

FIG. 22 is a schematic diagram illustrating an example of automatically generating a connection specification according to an embodiment of the present invention;

FIGS. 24A and 24B are schematic diagrams illustrating an example of inspecting a connection specification.

DETAILED DESCRIPTION OF THE PREFERRED EMBODIMENTS

Embodiments of the present invention are described with reference to the accompanying drawings.

<Configuration>

Figure 1A:
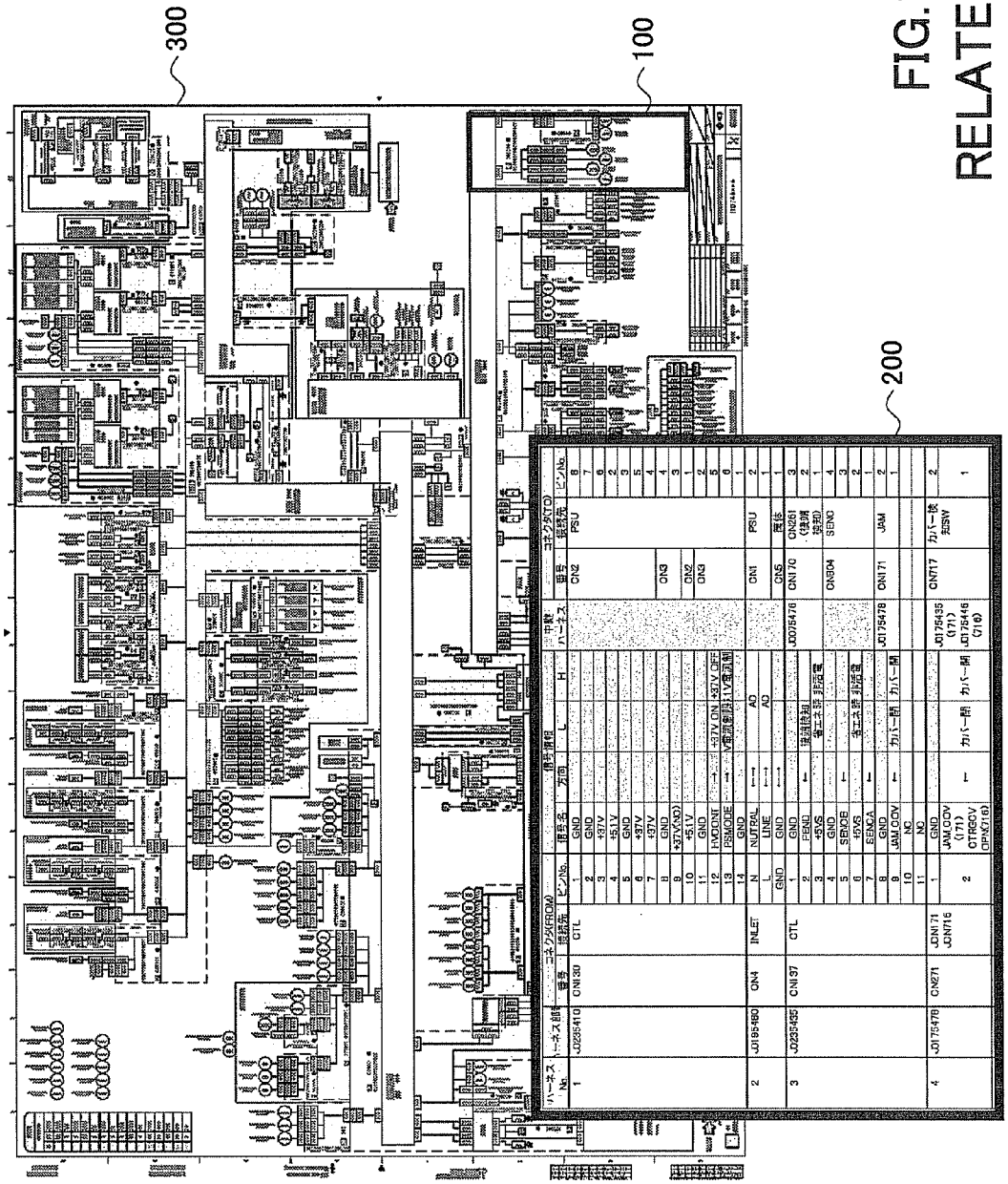
Figure 2:
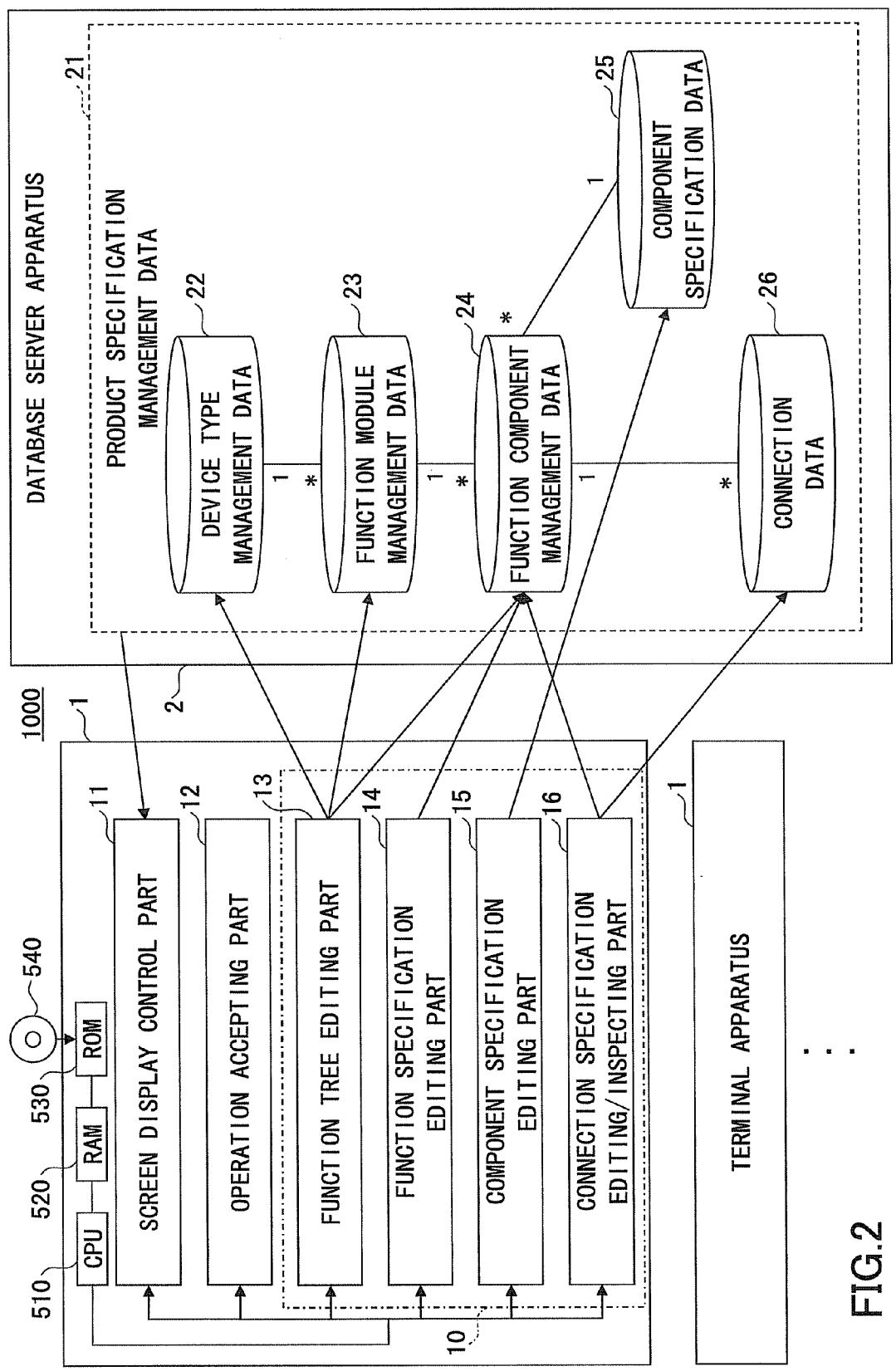
FIG. 2 is a schematic diagram illustrating a configuration of a system (editing system) for editing/inspecting an electric specification of an entire product according to an embodiment of the present invention.

FIG. 2 is a schematic diagram illustrating a configuration of a system (editing system) 1000 for editing/inspecting an electric specification of an entire product according to an embodiment of the present invention.

In FIG. 2, the editing system 1000 includes one or more multiple terminal apparatuses 1 and a database server 2 that is connected to at least one of the multiple terminal apparatuses 1 via a network. The database server 2 does not need to be a single apparatus but also may be a combination of separate independent apparatuses.

The terminal apparatus (also referred to as "editing/inspecting apparatus") 1 includes a screen display control part 11, an operation accepting part 12, a function tree editing part 13, a function specification editing part 14, a component specification editing part 15, and a connection specification editing/inspecting part 16. It is to be noted that the function tree editing part 13, the function specification editing part 14, the component specification editing part 15, and the connection specification editing/inspecting part 16 may be combined to form one or more updating parts 10 (in the example of FIG. 2, the function tree editing part 13, the function specification editing part 14, the component specification editing part 15, and the connection specification editing/inspecting part 16 are combined to form a single updating part 10). The terminal apparatus also includes a CPU (Central Processing Unit) 510, a memory (e.g., RAM (Random Access Memory)) 520, and a storage device (e.g., ROM (Read Only Memory) 530. The below-described functions of the screen display control part 11, the operation accepting part 12, the function tree editing part 13, the function specification editing part 14, the component specification editing part 15, and the connection specification editing/inspecting part 16 are performed by loading a program and data stored in the storage device 530 to the memory 520 and executing the program with the CPU 510. The program may be recorded in a computer-readable recording medium 540 or downloaded from a network and stored in the storage device 530.

The database server apparatus 2 has product specification management data 21 stored therein. The data specification management data 21 contains, for example, device type management data 22, function module management data 23, function component management data 24, component specification data 25, and connection data 26.

The product specification management data includes data used for managing a specification of a product. The device type management data 22 includes data used for managing a device type of a product. The function module management data 23 includes data used for managing a function module included in a product. The function component management data 24 includes data used for managing a function component included in a function module. The component specification data 25 includes data used for managing a specification of a function component. The connection data 26 includes data used for managing mutual connections among function components. The function component is a function name that is unique within a single product (subject). For example, it is a premise that a function component is provided in a product and mechatronic components or the like are provided to implement the function of the function component. A function specification is a specification (e.g., connection specification, device type dependency specification, selected component, unit, loading device type) that is determined according to the manner in which a function component is used with respect to each product. The component specification is a unique specification that is determined according to a component (e.g., mechatronic component) that is used.

The screen display control part 11 has a function of displaying the below-described function tree and IO table based on the product specification management data 21 of the database server 2.

The operation accepting part 12 has a function of accepting a user's (developer's) operations including instructions to the function tree or the IO table. The operation accepting part 12 may accept the operations by way of an input device (not illustrated) such as a mouse, a keyboard, or a touch panel directly/indirectly connected to the terminal apparatus 1.

The function tree editing part 13 has a function of editing the function tree in accordance with the user's operations. For example, the function tree editing part 13 may add/delete a function module or a function component with respect to the function tree.

The function specification editing part 14 has a function of editing the function specification. The function specification editing part 14 may perform, for example, setting of a device type of a function component or selection of a component (setting of a component number).

The component specification editing part 15 has a function of editing, according to the operation of the user, a specification that is unique to a component selected as a function component.

The connection specification editing/inspecting part 16 has a function of, for example, assigning a connection between function components, editing the IO table, generating the connection specification, and inspecting the connection specification.

Figure 3:
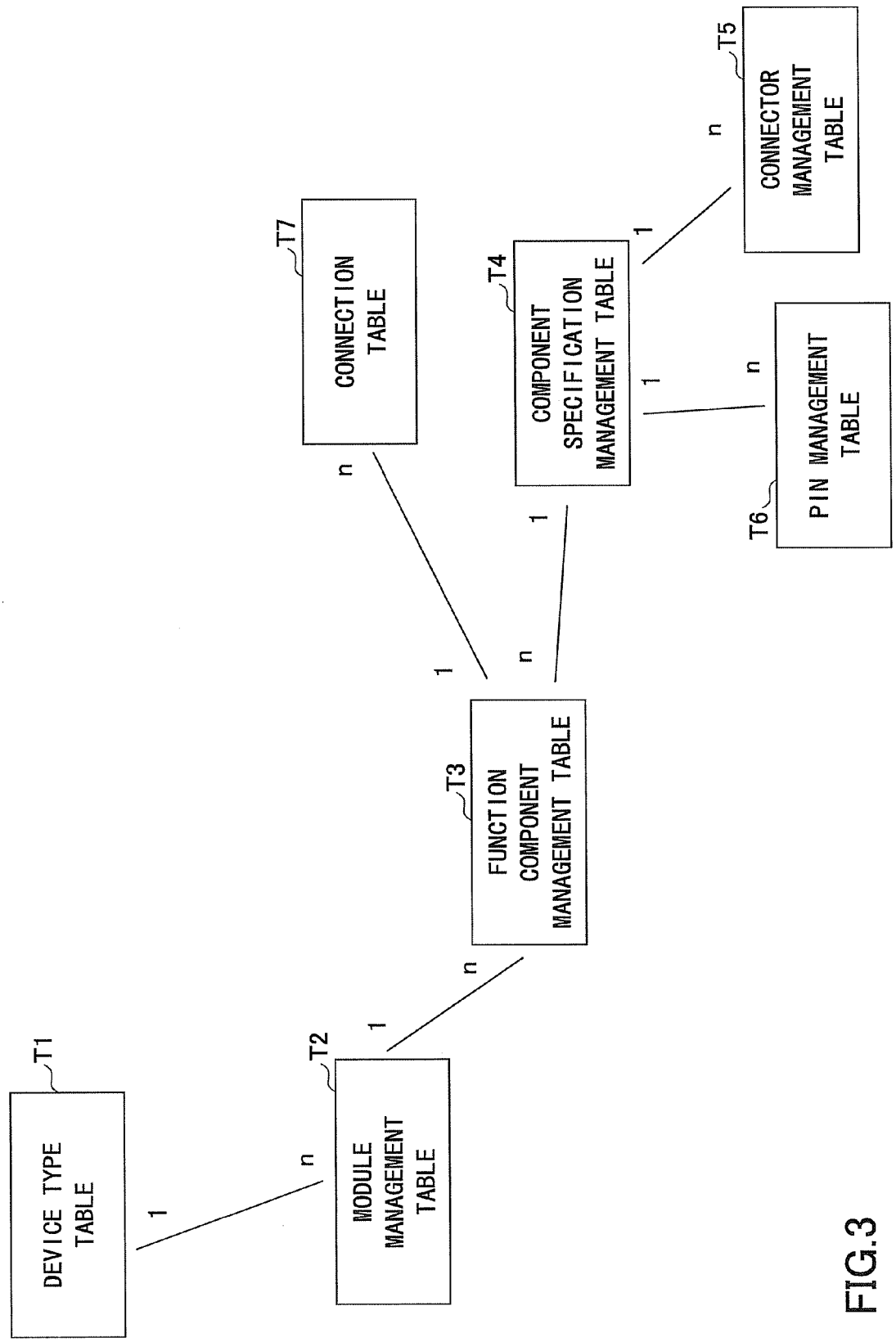
FIG. 3 is a schematic diagram illustrating various tables constituting product specification management data according to an embodiment of the present invention.

FIG. 3 is a schematic diagram illustrating various tables constituting the product specification management data 21 according to an embodiment of the present invention.

In FIG. 3, a device type table T1, a module management table T2, a function component management table T3, a component specification management table T4, a connector management table T5, a pin management table T6, and a connection table T7 are main tables constituting the product specification management data 21 according to an embodiment of the present invention. The device type table T1 corresponds to the device type management data 22 illustrated in FIG. 2. The module management table T2 corresponds to the function module management data 23 illustrated in FIG. 2. The function component management table T3 corresponds to the function component management data 24 illustrated in FIG. 2. The component specification management table T4, the connector management table T5, and the pin management table T6 correspond to the component specification data 25 illustrated in FIG. 2. The connection table T7 corresponds to the connection data 26 illustrated in FIG. 2.

FIG. 4 is a schematic diagram illustrating an example of the device type table T1. The device type table T1 includes items such as "subject code", "device type code", and "device type name". The item "subject code" is data that distinguishes (identifies) a subject of a product or the like. The item "device type" is data that distinguishes a device type. The item "device type name" is a name of a device type.

FIG. 5 is a schematic diagram illustrating an example of the module management table T2. The module management table T2 includes items such as "subject code", "function module ID", "parent function module ID", "function name", and "module L". The item "subject code" is data that distinguishes a subject of a product or the like. The item "function module ID" is data that distinguishes a function module. The item "parent function module ID" is data that distinguishes an upper level function module (superordinate function module) that includes a lower level function module (subordinate function module). The item "function name" is a name of a function. The item "module L" is data that indicates a person in charge of a function module.

FIG. 6 is a schematic diagram illustrating an example of the function component management table T3. The function component management table T3 includes items such as "subject code", "function ID", "parent function module ID", "function category", "selected component component No.", "function name", "function distinguisher", "type", "person in charge", and "connection status". The item "subject code" is data that distinguishes a subject of a product or the like. The item "function ID" is data that distinguishes a function component. The item "parent function module ID" is data that distinguishes an upper level function module (superordinate function module) that includes a lower level function module (subordinate function module). The item "function category" is a category to which a function component belongs. The category may be, for example, a mechatronic component, a substrate, or a wiring harness component. The item "selected component component No." is a component number of a function component that is to be actually selected as a function component. The item "function name" is a name of a function. The item "function distinguisher" is data that distinguishes a function component. The item "type" is a specific category to which a function component belongs. The specific category may be, for example, type of substrate type, type of mechatronic component, or type of wiring harness component. The item "person in charge" is data that distinguishes a person (person in charge) that has selected a function component. The item "connection status" indicates a connection status of a pin of a function component. For example, the item "connection status" indicates "not connected (not a single pin connected to a component)", "partly connected", and "all connected".

FIG. 7 is a schematic diagram illustrating an example of the component specification management table T4. The component specification management table T4 includes items such as "component number" and "type". The item "component number" is a component number of a function component. The item "type" is a specific category of a function component.

FIG. 8 is a schematic diagram illustrating an example of the connector management table T5. The connector management table T5 includes items such as "parent component number", "connector address", and "connector component number". The item "parent component number" is a component number of a function component including a connector. The item "connector address" is data that distinguishes a connector. The item "connector component number" is a component number of a connector.

FIG. 9 is a schematic diagram illustrating an example of the pin management table T6. The pin management table T6 includes items such as "parent component number", "connector address", "Pin No.", "signal", and "I/O". The item "parent component number" is a component number of a function component including a connector. The item "connector address" is data that distinguishes a connector to which a pin belongs. The item "Pin No." is a number of a pin. The item "signal" is data indicating a signal provided to a pin. The item "I/O" differentiates, for example, input and output of a pin. For example, the item "I/O" includes "I (input)", "O (output)", "B (bi-directional)", "P (power source)", "G (ground)", and "N (not connected)".

FIG. 10 is a schematic diagram illustrating an example of the connection table T7. The connection table T7 includes items such as "function ID", "connector address", "Pin No.", "connection target function ID", "connection target connector address", "connection target Pin No.", "direction", "inspection status", and "error acknowledgement status". The item "function ID" is data that distinguishes a function component of a connection source. The item "connector address" is data that distinguishes a connector of a function component of a connection source. The item "Pin No." is data that distinguishes a pin of a connector of a function component of a connection target. The item "connection target function ID" is data that distinguishes a function component of a connection target. The item "connection target connector address" is data that distinguishes a connector of a function component of a connection target. The item "connection target Pin No." is data that distinguishes a pin of a connector of a function component of a connection target. The item "direction" is data indicating a direction of a signal of a pin to be connected. The item "inspection status" is data indicating, for example, whether a connection has been inspected. The item "error acknowledgement status" is data indicating, for example, whether an error has been acknowledged by a person in charge. The item "reason for acknowledgement" is data indicating a reason for acknowledging an error.

<Operation>
<Display of Function Tree and IO Table>

In FIG. 2, a screen display control part of the terminal apparatus 1 displays a function tree based on the product specification management data 21 stored in the database server apparatus 2.

FIGS. 11A and 11B are schematic diagrams illustrating an example displaying a configuration of the function tree. The configuration of the function tree has a hierarchical function configuration including elements related to a product (as shown on the left side of FIGS. 11A and 11B) along with attributes of each of the elements (as shown on the right side of FIGS. 11A and 11B). In the hierarchical function configuration on the left side of FIGS. 11A and 11B, a product name "XXXXXXX", serving as a subject, is the root of the function tree. Further, function modules "controller electric section" and "engine electric section" are positioned at a level below the subject (in this case, product name "XXXXXXX"). Further, function components such as "CTL", "BCU", and "IOB" are positioned at a level below the function modules. Further, connectors of a connection source "CN101", "CN301", and "CN230" are positioned at a level below the function components. Further, connectors and function components of the connection target such as "CN301 BCU", "CN101 CTL", "CN1 document detection sensor", and "CN1 drum development motor (Y)" are positioned at a level below the connectors of the connection source.

On the right side of the function tree, attributes such as "number of pins", "status", "type" "Component No.", "function distinguisher", "component specification", "device type dependency specification", "loading device type", "unit", "person in charge", "function distinguisher", and "remarks" are displayed.

Further, the screen display control part 11 of the terminal apparatus 1 displays an IO table when the operation accepting part 12 accepts an instruction to display an IO table where one or more function components have been selected from the function tree by the user.

FIG. 12 is a schematic diagram illustrating an example of an IO table. The IO table of FIG. 12 displays a connection relationship between the function component "IOB (IO control board)" and the "document detection sensor" of FIG. 11.

FIG. 13 is schematic diagram illustrating another example of an IO table. The IO table of FIG. 13 displays more data compared to the IO table of FIG. 12.

FIGS. 14-16 are examples of table records used by the screen display control part 11 of the terminal apparatus 1 for displaying the function tree and the IO table. The table records illustrate a hierarchic relationship among the product name "XXXXXXX", the function module "engine electricity section", the function component "IOB", the connector "CN230", the connector/function component "CN1 document detection sensor" of FIG. 11.

A device type table record T1-1 of FIG. 14A is associated with a module management table record T2-1 of FIG. 14B by way of a subject code "AFN01". Further, the module management table record T2-1 is associated with a function component management table record T3-1 of FIG. 14C and a function component management table record T3-2 of FIG. 16A by way of a function module ID "1001". The device type table record T1-1 of FIG. 14A is associated with the function component management table record T3-1 of FIG. 14C and the function component management table record T3-2 of FIG. 16A by way of the subject code "AFN01".

Further, the function component management table record T3-1 of FIG. 14C is associated with a component specification management table record T4-1 of FIG. 14D by way of a selected component Component No. "AFE015122". The component specification management table record T4-1 is associated with a connector management table record T5-1 of FIG. 14E and pin management table records T6-1, T6-2, T6-3 of FIGS. 14F-14H by way of Component No. "AFE015122". The function component management table record T3-2 of FIG. 16A is associated with a component specification management table record T4-2 of FIG. 16B by way of the selected component Component No. "AX060443". The component specification management table record T4-2 of FIG. 16B is associated with a connector management table record T5-2 of FIG. 16C and pin management table records T6-4, T6-5, and T6-6 of FIGS. 16D-16F.

Further, the pin management table records T6-1, T6-2, and T6-3 of FIGS. 14F-14H are associated with connection table records T7-1, T7-2, and T7-3 of FIGS. 15A-15C by way of the connector address "CN230" and Pin Nos. "1", "2", "3", respectively. The pin management table records T6-4, T6-5, T6-6 of FIGS. 16D-16F are associated with the connection table records T7-1, T7-2, and T7-3 of FIGS. 15A-15C by way of the connector address "CN1" and Pin Nos. "1", "2", "3", respectively.

The screen display control part 11 of the terminal apparatus 1 refers to the device type table record T1-1, the module management table record T2-1, the function component management table record T3-1, the component specification management table record T4-1, the connector management table record T5-1, the pin management table records T6-1, T6-2, T6-3, the connection table records T7-1, T7-2, T7-3, the pin management table records T6-4, T6-5, T6-6, the connector management table record T5-2, the component specification management table record T4-2, and the function component management table record T3-2 in this order, then recognizes the hierarchy (hierarchic relationship) of the product name "XXXXXXX", the function module "engine electric section", the function component "IOB", the connector "CN230", and the connector/function component "CN1 document detection sensor", and then, displays the recognized hierarchical relationship and the attributes of each element of the recognized hierarchy on a screen. It is, however, to be noted that, the order in which the screen display control part 11 refers to each of the table records is not limited to that described above.

Further, the screen display control part 11 of the terminal apparatus 1 displays an IO table when the operation accepting part 12 accepts an instruction to display an IO table where one or more function components have been selected from the function tree by the user. The screen display control part 11 displays the IO table by obtaining data from the function component management table record corresponding to the selected function component(s) and data of the record tables directly/indirectly associated with the function component management table record (e.g., component specification management table record, connector management table record, pin management table record, connection table record) and displaying the IO table containing the obtained data.

<Editing of Function Tree>

When the operation accepting part 12 accepts an instruction to add or delete a function module or a function component with respect to the function tree from the user, the function tree editing part 13 of the terminal apparatus 1 adds or deletes a corresponding module management table record or a corresponding function component management table record. Then, the display of the function tree is updated to a latest version (newest state) by the screen display control part 11 of the terminal apparatus 1. That is, the screen display control part 11 displays the function tree that has been edited to a newest state by the function tree editing part 13.

When the operation accepting part 12 accepts an instruction to, for example, set the type of function component or select a component with respect to the function tree from the user, the function specification editing part 14 of the terminal apparatus 1 updates a corresponding function component management table record (i.e. function component management table record corresponding to a set function component or selected component) and other table records directly/indirectly associated with the function component management table. Then, the display of the function tree is updated to a latest version (newest state) by the screen display control part 11 of the terminal apparatus 1. That is, the screen display control part 11 displays the function tree including table records updated to a newest state by the function specification editing part 14.

When the operation accepting part 12 accepts an instruction to edit a specification unique to a component (selected as a function component) with respect to the function tree from the user, the component specification editing part 15 of the terminal apparatus 1 updates a corresponding function component management table record (i.e. function component management table record corresponding to the selected function component) and other table records directly/indirectly associated with the function component management table. Then, the display of the function tree is updated to a latest version (newest state) by the screen display control part 11 of the terminal apparatus 1. That is, the screen display control part 11 displays the function tree including table records updated to a newest state by the component specification editing part 15.

<Assigning of Connection Between Function Components>

When the operation accepting part 12 accepts an instruction to assign a connection between function components from the user, the connection specification editing/inspecting part 16 of the terminal apparatus 1 generates a connection table record indicating a connection between two function components and updates other table records related to the generated connection table. Then, the display of the function tree is updated to a latest version (newest state) by the screen display control part 11 of the terminal apparatus 1. That is, the screen display control part 11 displays the function tree including connection table generated by the connection specification editing/inspecting part 16.

FIGS. 17 and 18 are schematic diagrams illustrating an example of an operation of assigning a connection(s) between function components.

In FIG. 17, in a case of assigning connection of the function components "document detection sensor 1", "document detection sensor 2", and "document detection sensor 3" (which are positioned at a level below the function module "reading section") with respect to the function component "IO control board 1" (which is positioned at a level below the function module "engine electric section"), connectors "CN1" of the function components "document detection sensor 1", "document detection sensor 2", and "document detection sensor 3" are dragged and dropped to a connector "CN undecided" positioned at a level below the function component "IO control board 1". The user may drag and drop the connectors "CN1" of the function components "document detection sensor 1", "document detection sensor 2", and "document detection sensor 3" together or one by one with a mouse or the like.

By this drag and drop operation, the connection specification editing/inspecting part 16 recognizes that the function component "IO control board 1" has been assigned to be connected to the function components "document detection sensor 1", "document detection sensor 2", and "document detection sensor 3" and generates a connection table record indicating a connection between the function component "IO control board 1" and the function components "document detection sensor 1", "document detection sensor 2", and "document detection sensor 3". In addition, the connection specification editing/inspecting part 16 updates other table records related to the generated connection table. Then, the display of the function tree is updated to a latest version (newest state) by the screen display control part 11 of the terminal apparatus 1. FIG. 18 shows the display of the function tree after the assignment of connection between the function component "IO control board 1" and the function components "document detection sensor 1", "document detection sensor 2", and "document detection sensor 3".

Further, in a case of cancelling (releasing) the connection assigned between the function components, a function component that is to have its assigned connection cancelled is selected. Then, the assigned connection of the selected function component is cancelled by, for example, displaying a context menu including "cancellation of assigned connection" by right-clicking the selected function component and selecting "cancellation of assigned connection" with a mouse or the like. Alternatively, by dragging and dropping the selected function component to a level below another function component, a new connection can be assigned between the selected function component and the other function component but also, at the same time, the connection previously assigned to the selected function component can be cancelled.

FIG. 19 is a flowchart illustrating an example of the above-described process of assigning a connection between function components.

In FIG. 19, the process of assigning a connection between function components is started by performing a drag & drop operation on, for example, a function component (Step S11). Then, it is determined whether the source of the assigned connection (assignment source) is a connector (Step S12).

In the case where the assignment source is a connector ("Yes" at Step S12), it is determined whether the target of the assigned connection (assignment target) is a function component or a connector (Step S13).

In the case where the assignment target is determined to be a function component or a connector ("Yes" at Step S13), it is determined whether the connector of the assignment source and the connector of the assignment target are different (i.e. separate connectors) (Step S14).

In the case where the connector of the assignment source and the connector of the assignment target are different ("Yes" at Step S14), the connection data 26 is updated (Step S15). Then, the display of the function tree is updated (Step S16). Thereby, the process of assigning a connection between function components is terminated (Step S18).

In the case where the assignment source is not a connector ("No" at Step S12) or in the case where the assignment target is neither a function component nor a connector ("No" at Step S13), or in the case where the connector of the assignment source and the connector of the assignment target are the same ("No" at Step S14), an error is displayed to indicate that the connection cannot be assigned (Step S17). Thereby, the process of assigning a connection between function components is terminated (Step S18).

<Editing of IO Table>

Figure 20A:
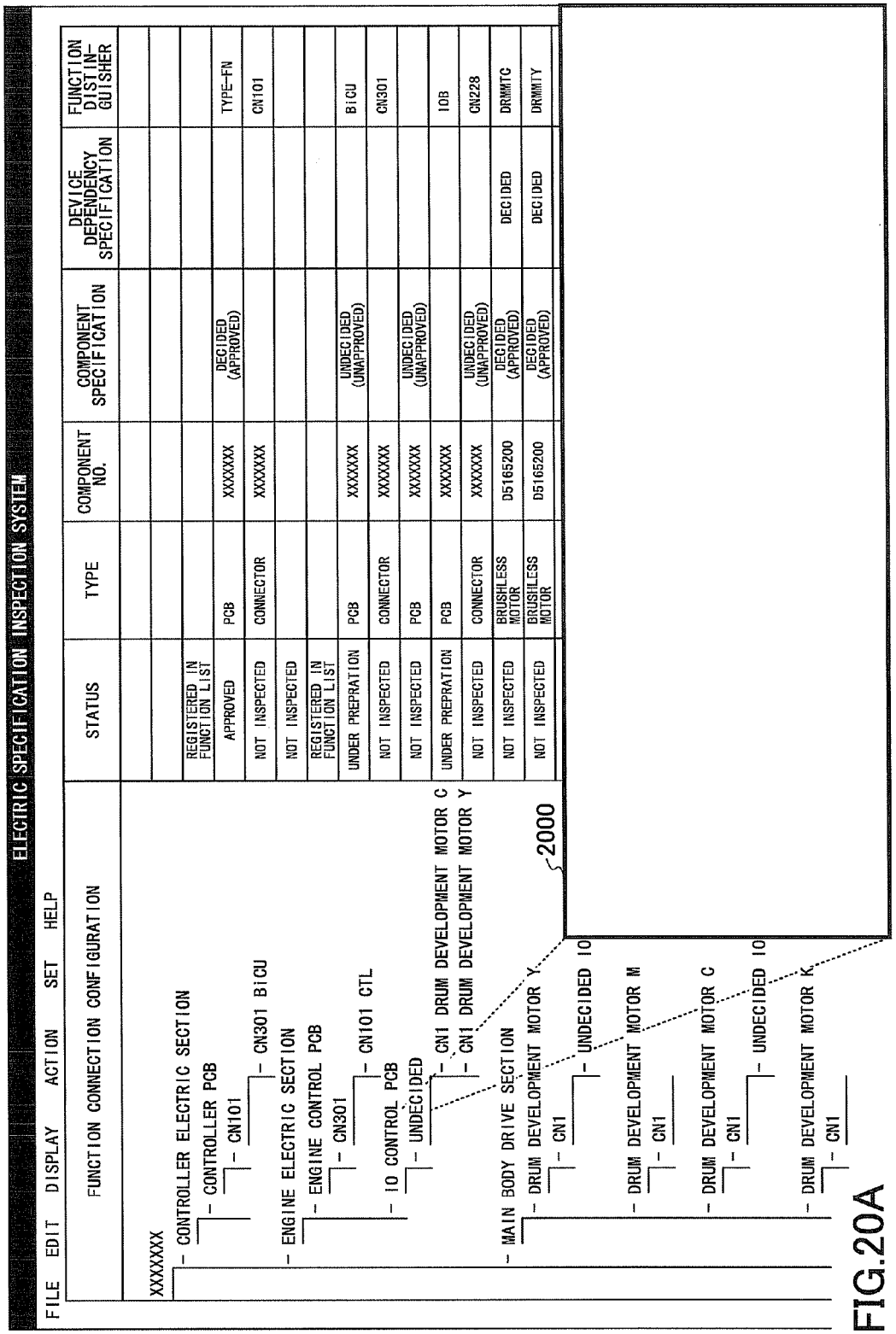

When the operation accepting part 12 accepts an instruction to edit an item(s) of an IO table in units of pins from the user, the connection specification editing/inspecting part 16 of the terminal apparatus 1 updates the connection table record and other table records related to the updated connection table. Then, the display of the connection table record and the related table records are updated to a latest version (newest state) by the screen display control part 11 of the terminal apparatus 1. FIGS. 20A and 20B are schematic diagrams illustrating an example of editing (in detail) a connection in units of pins. In this example, an IO table is to be edited with respect to a connector "undecided" of a function component "IO control PCB". FIG. 20B is an enlarged view of an IO table indicated with reference numeral 2000 in FIG. 20A. It is to be noted that any one of the items in the IO table can be edited in units of pins. In addition, the arrangement of pins can also be changed.

<Automatic Generation of Connection Specification>

When the operation accepting part 12 accepts an instruction to automatically generate a connection specification of a connection source with respect to the IO table, the connection specification editing/inspecting part 16 of the terminal apparatus 1 automatically generates data pertaining to the connection specification (e.g., signal name, I/O) of the connection source based on the connection specification of the connection target and sets the generated data to the IO table. Then, the display of the IO table is updated to a latest version (newest state) by the screen display control part 11 of the terminal apparatus 1.

A connection specification of a connection source is often in an "undecided state" at a stage where connection is assigned to a connector of the connection source. Therefore, with the related art example, the user is required to manually set, for example, data of the connection specification. However, the manual setting of the data of the connection specification easily to led to errors. On the other hand, with the above-described embodiment of the present invention, the connection specification of the connection source can be automatically generated based on the connection specification of the connection target.

Figure 21:
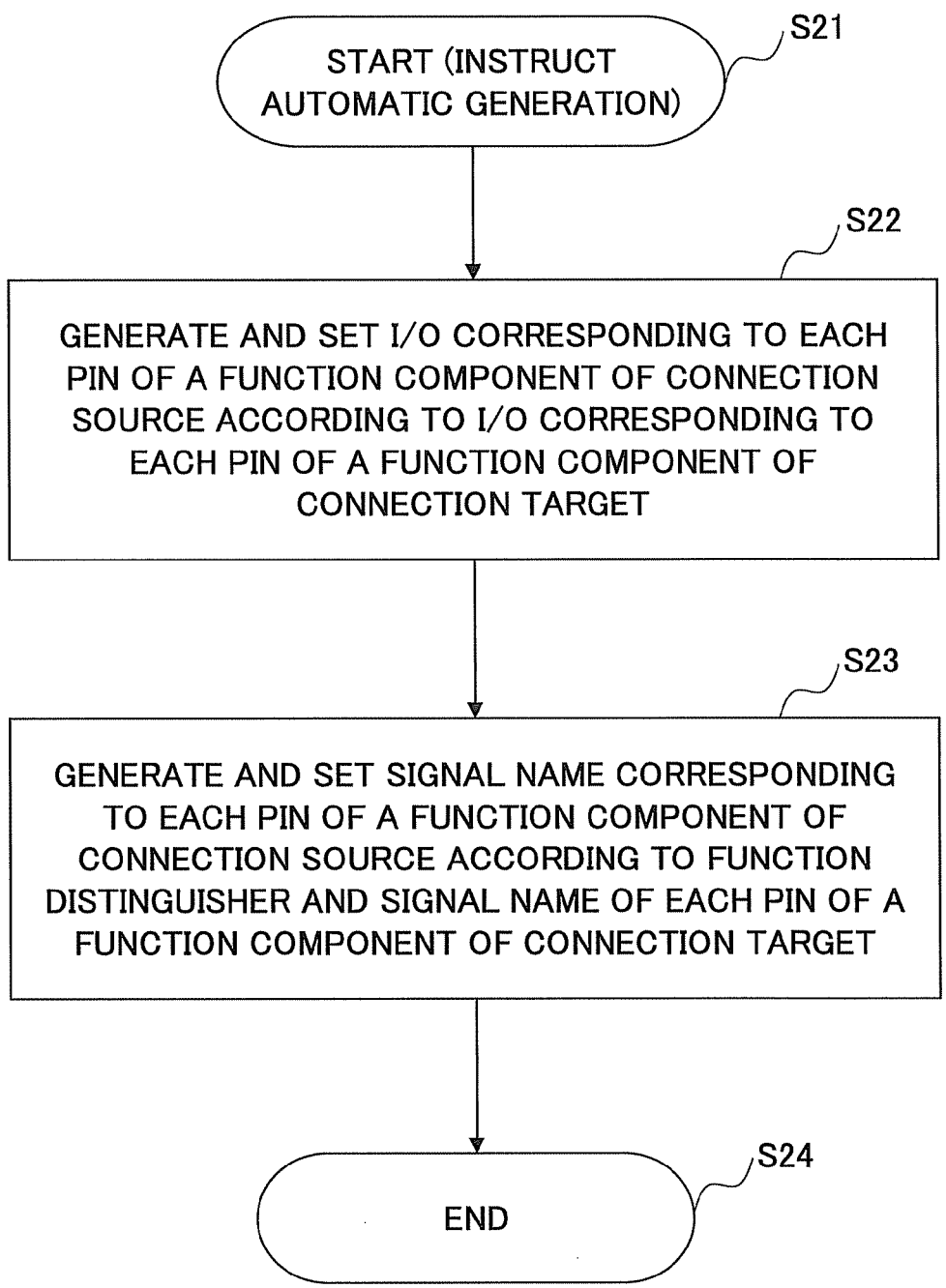
FIG. 21 is a flowchart of an example of a process of automatically generating a connection specification.

FIG. 21 is a flowchart illustrating an example of the above-described process of automatically generating a connection specification.

In FIG. 21, the process of automatically generating a connection specification is started when the operation accepting part 12 accepts an instruction to automatically generate a connection specification from the user (Step S21). Then, an I/O of a function component of a connection source is generated for each pin based on an I/O corresponding to each pin of a function component of a connection target, and a connection table record is set based on the generated I/O (Step S22). For example, in a case where the I/O of a pin of the function component of the connection target is input "I", the I/O of a pin of the function component of the connection source is set as output "O"; in a case where the I/O of a pin of the function component of the connection target is output "O", the I/O of a pin of the function component of the connection source is set as input "I"; in a case where the I/O of a pin of the function component of the connection target is bidirectional "B", the I/O of a pin of the function component of the connection source is set as bidirectional "B"; in a case where the I/O of a pin of the function component of the connection target is power source "P", the I/O of a pin of the function component of the connection source is set as power source "P"; and in a case where the I/O of a pin of the function component of the connection target is ground "G", the I/O of a pin of the function component of the connection source is set as ground "G". In a case where a pin of the function component of the connection source is not connected, the I/O of the pin of the connection source is set as not connected "N".

Then, a signal name of each pin of the function component of the connection source is generated based on the function distinguishers and signal names corresponding to each pin of the function component of the connection target, and a connection table record is set (Step S23). Thereby, the process of automatically generating a connection specification is terminated (Step S24). For example, in a case where the function distinguisher of the connection destination is "DRMMT_Y" and the signal name of the connection destination is "LOK_N", the signal name of the connection source is set as "DRMMT_Y_LOK_N" ("DRMMT_Y" and "LOK_N" connected with an underscore "_"). Further, the I/O corresponding to "ground", "power source" and "not connected" is indicated as "GND", "+5V", and "N.C." instead of using a function distinguisher.

FIG. 22 is a schematic diagram illustrating an example of automatically generating a connection specification. FIG. 22 shows a state where the spaces for the "signal name" and "I/O" of the connection source, which were initially blank at the time of assigning connections, are automatically filled in.

<Automatic Inspection of Connection Specification>

When the operation accepting part 12 accepts an instruction to automatically inspect a connection specification of a connection source with respect to the IO table, the connection specification editing/inspecting part 16 of the terminal apparatus 1 inspects the connection specification of the connection source by obtaining values anticipated to be set to the connection specification (e.g., signal name, I/O) of the connection source based on the connection specification of the connection target and comparing the actual values set to the connection specification of the connection source with the obtained anticipated values. Then, the connection specification editing/inspecting part 16 displays the results of the inspection by way of the screen display control part 11.

Figure 23:
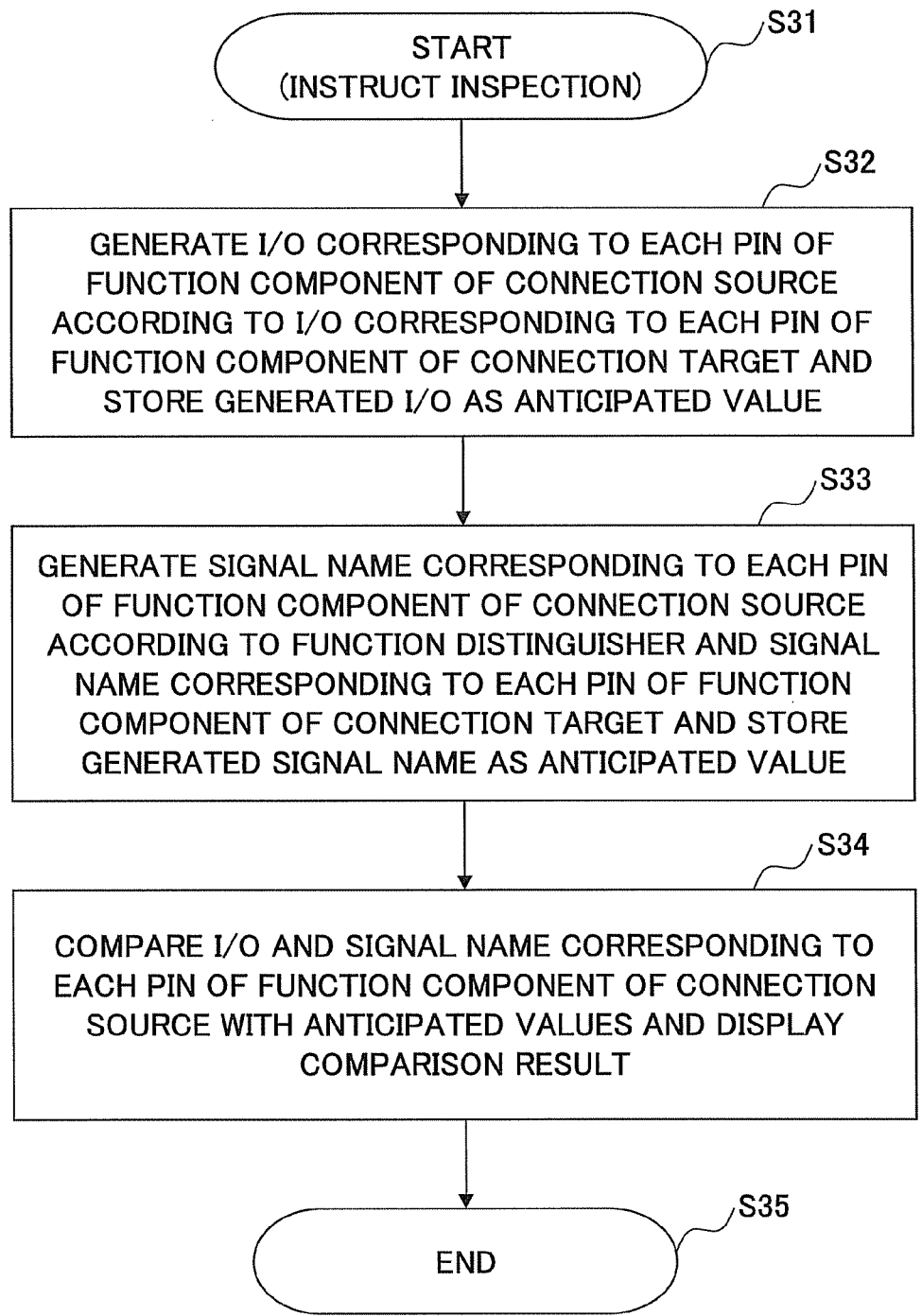
FIG. 23 is a flowchart of an example of a process of automatically inspecting a connection specification.

FIG. 23 is a flowchart illustrating an example of the above-described process of automatically inspecting a connection specification.

In FIG. 23, the process of automatically inspecting a connection specification is started when the operation accepting part 12 accepts an instruction to automatically inspect a connection specification from the user (Step S31). Then, an I/O corresponding to each pin of the function component of the connection source is generated based on the I/O of each pin of the function component of the connection target, and the generated I/O is temporarily stored in, for example, the memory 520 as an anticipated value of the connection specification of the connection source (Step S32).

Then, a signal name of each pin of the function component of the connection source is generated based on the function distinguisher and the signal name of each pin of the function component of the connection target, and the generated signal name is temporarily stored in, for example, the memory 520 as an anticipated value of the connection specification of the connection source (Step S33).

Then, the I/O and the signal name of each pin of the function component of the connection source are compared with corresponding anticipated values stored in the memory 520 of the terminal apparatus 1, and the results of the comparison is displayed (Step S34). Thereby, the process of automatically inspecting a connection specification is terminated (Step S35).

Figure 24A:
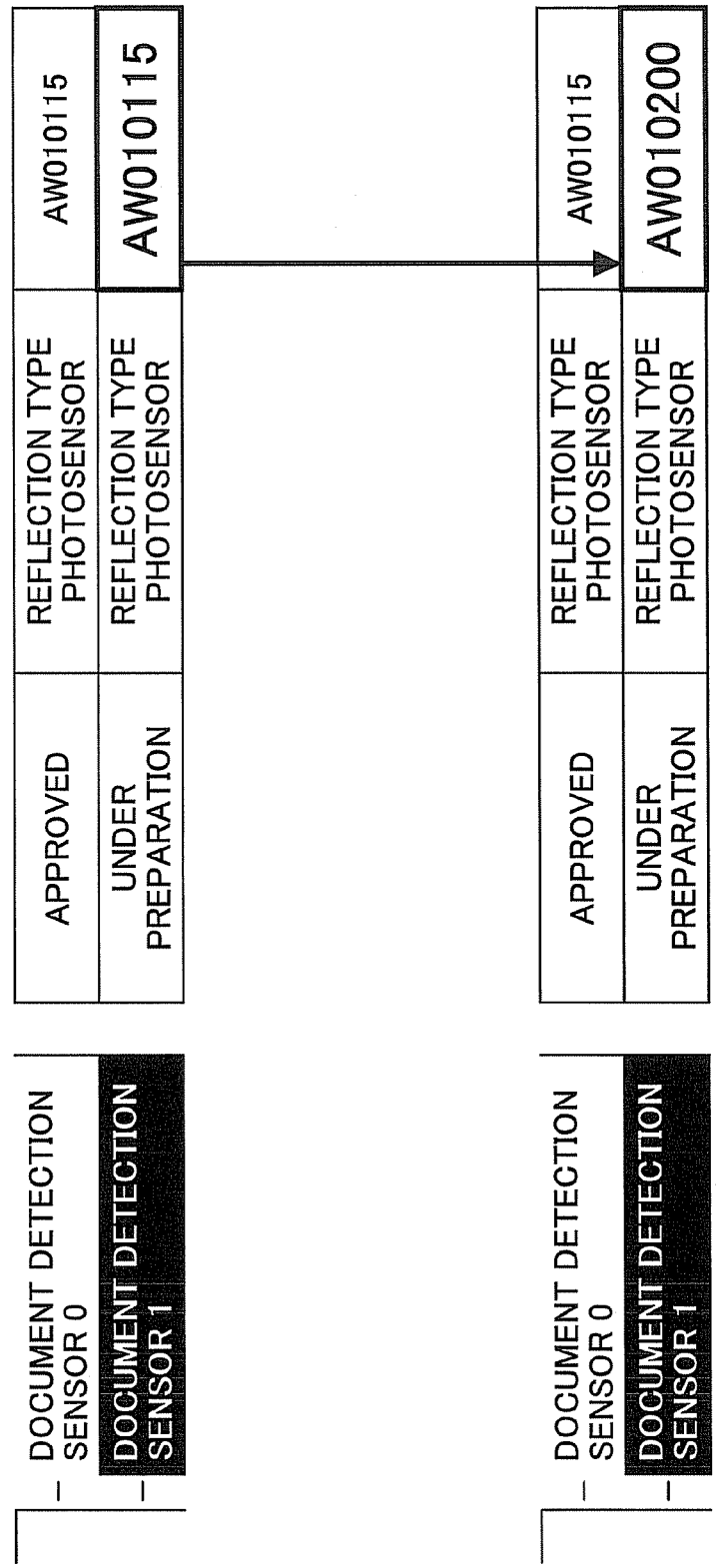

FIGS. 24A and 24B are schematic diagrams illustrating an example of inspecting a connection specification. In a case where the IO table illustrated on the upper side of FIG. 24B corresponds to the function tree illustrated in the upper side of FIG. 24A, it is assumed that a person in charge of mechatronic components changes (edits) a component number "AW010115" of a function component "document detection sensor 1 (reflection type photosensor)" of the function tree of the upper side of FIG. 24A to a component number "AW010200" of the lower side of FIG. 24A. In this case, the connection specification of the function component of the connection target is immediately changed by the editing of the function tree of FIG. 24A. Thereby, the connection specifications for Pin Nos. "1" and "3" are changed (switched) as illustrated in FIG. 24B.

For example, with the related art example, although a person in charge of PCB is required to visually inspect the connection specification of the connection source, it is difficult for the person in charge of PCB to anticipate the timing with which the connection specification is changed or anticipate whether the connection specification is changed because the change is performed by the person in charge of mechatronic components. Thereby, the change of connection specification may be overlooked. On the other hand, inconsistency of the connection specification can be positively inspected by generating anticipated values of the connection specification of the connection source based on the content of the changed connection specification of the connection target, comparing the actual connection specification of the connection source with the generated anticipated values, and displaying the comparison (inspection) results by using, for example, color emphasis. Accordingly, the person in charge of PCB can recognize the inconsistency of the connection specification.

Hence, owing to the cooperative operation of the function tree and the IO table according to the above-described embodiment of the present invention, a designing process can be facilitated even at an early stage where specifications of a product are undefined.

Further, due to the automatic generation of connection specifications of elements corresponding to elements in the IO table according to the above-described embodiment of the present invention, the designing process can be performed efficiently with a reduced risk of human error.

Further, due to inspection of inconsistency by comparing connection specifications of elements corresponding to elements in the IO table according to the above-described embodiment of the present invention, the design process can be performed efficiently with a reduced risk of human error.

The present invention is not limited to the specifically disclosed embodiments, and variations and modifications may be made without departing from the scope of the present invention.

What is claimed is:

1. An editing system, comprising:
   a database server apparatus having product specification management data stored therein; and
   a terminal apparatus including:
      a display part configured to display a function tree and an IO table, the function tree hierarchically indicating a name of elements simultaneously along with a chart of attributes of each of the elements based on the product specification management data and having a product name as a root of the function tree, and the IO table indicating connection data between each pin of the elements based on the product specification management data,
      an accepting part configured to accept an operation to connect one of the elements to another one of the elements, an operation to display connection data between the elements, and an operation to edit each item of the connection data of the IO table, and
      an updating part configured to update the connection data of the product specification management data in accordance with the operations accepted by the operation accepting part.

2. The editing system as claimed in claim 1,
   wherein the accepting part is configured to accept an operation to automatically generate connection data corresponding to the elements of the IO table, and
   wherein the updating part is configured to automatically generate the connection data corresponding to the elements of the IO table based on the product specification management data.

3. The editing system as claimed in claim 1,
   wherein the accepting part is configured to accept an operation to automatically inspect connection data corresponding to the elements of the IO table,
   wherein the updating part is configured to automatically generate the connection data corresponding to the elements of the IO table based on the product specification management data, and inspect existence of an inconsistency by comparing the generated connection data with connection data of the elements of the IO table, and
   wherein the display part is configured to display a result of the inspection.

4. An editing method, comprising the steps of:
   displaying a function tree that hierarchically indicates a name of elements simultaneously along with a chart of attributes of each of the elements based on product specification management data, and has a product name as a root of the function tree;
   accepting an operation to connect one of the elements to another one of the elements;
   updating, using a computer, connection data of the product specification management data;
   accepting an operation to display connection data between the elements;
   displaying an IO table indicating connection data between each pin of the elements based on the product specification management data;
   accepting an operation to edit each item of the connection data of the IO table; and
   updating, using the computer, the connection data of the product specification management data.

5. A non-transitory computer-readable recording medium on which a program for causing a computer to perform an editing method is recorded, the editing method comprising the steps of:
   displaying a function tree that hierarchically indicates a name of elements simultaneously along with a chart of attributes of each of the elements based on product specification management data and has a product name as a root of the function tree;
   accepting an operation to connect one of the elements to another one of the elements;
   updating connection data of the product specification management data;
   accepting an operation to display connection data between the elements;
   displaying an IO table indicating connection data between each pin of the elements based on the product specification management data;
   accepting an operation to edit each item of the connection data of the IO table; and
   updating the connection data of the product specification management data.

* * * * *